United States Patent
Hattori et al.

(10) Patent No.: US 6,744,580 B2
(45) Date of Patent: Jun. 1, 2004

(54) METHOD AND APPARATUS FOR REPRODUCING DATA AND METHOD AND APPARATUS FOR RECORDING AND/OR REPRODUCING DATA

(75) Inventors: Masayuki Hattori, Kanagawa (JP); Toshiyuki Miyauchi, Tokyo (JP); Jun Murayama, Tokyo (JP)

(73) Assignee: Sony Corporation, Tokyo (JP)

( * ) Notice: Subject to any disclaimer, the term of this patent is extended or adjusted under 35 U.S.C. 154(b) by 219 days.

(21) Appl. No.: 09/814,429

(22) Filed: Mar. 21, 2001

(65) Prior Publication Data

US 2001/0048564 A1 Dec. 6, 2001

(30) Foreign Application Priority Data

Mar. 23, 2000 (JP) .......................... 2000-087126

(51) Int. Cl.[7] .................. G11B 5/09; G11B 20/10
(52) U.S. Cl. ..................... 360/40; 360/39; 360/55; 714/792; 714/796
(58) Field of Search ................. 360/40, 55, 39, 360/51, 53; 341/50, 59; 714/792, 755, 794, 795, 796

(56) References Cited

U.S. PATENT DOCUMENTS

| | | | |
|---|---|---|---|
| 5,396,518 A | * 3/1995 | How ........................ | 375/265 |
| 5,821,883 A | * 10/1998 | Chiba et al. ................ | 341/59 |
| 5,933,462 A | * 8/1999 | Viterbi et al. .............. | 375/341 |
| 6,023,783 A | * 2/2000 | Divsalar et al. ............ | 714/792 |
| 6,046,691 A | * 4/2000 | Aziz et al. .................. | 341/58 |
| 6,389,574 B1 | * 5/2002 | Belveze et al. ............. | 714/795 |

OTHER PUBLICATIONS

Fan et al., "Constrained Coding Techniques for Soft Iterative Decoders", 99', IEEE Global Telecommunications Conference, pp. 723–727.*

J. Petersen: "Implementierungsaspekte zur Symbol-by-Symbol MAP-Decodierung von Faltungscodes" ITG Fachebrichte, vol. 130, Jan. 1, 1994, pp. 41–48, XP000503776 Berlin.

R.D. Cideciyan et al.: "A PRML System for Digital Magnetic Recording" IEEE Journal on Selected Areas in Communications, vol. 10, No. 1, Jan. 1992, pp. 38–56, XP000457625 New York.

(List continued on next page.)

Primary Examiner—David Hudspeth
Assistant Examiner—Natalia Figueroa
(74) Attorney, Agent, or Firm—Frommer Lawrence & Haug LLP; William S. Frommer; Gordon Kessler

(57) ABSTRACT

A magnetic recording and/or reproducing apparatus performing efficient decoding to lower a decoding error rate. A magnetic recording and/or reproducing apparatus 50 includes a modulation SISO decoder 63 for modulation decoding data modulation-encoded in a predetermined fashion by a modulation coder 52. In the magnetic recording and/or reproducing apparatus 50, the modulation SISO decoder 63 is a soft input soft output (SISO) type modulation decoder fed with a soft input signal and issuing a soft output signal. The modulation SISO decoder 63 is fed with a trellis soft output signal D64 supplied from a trellis SISO decoder 62 to find a soft decision value for an error correction coding data D52 fed to the modulation coder 52 of the recording system to generate a modulated soft decision signal D65. The modulation SISO decoder 63 routes the so-generated modulated soft decision signal D65 to a downstream side error correction soft decoder 64.

28 Claims, 8 Drawing Sheets

OTHER PUBLICATIONS

J.L. Fan and J.M. Cioffi: "Constrained Coding Techniques for Soft Iterative Decoders" GLOBECOM'99, vol. 1b, Dec. 5–9, 1999, pp. 723–727, XP002170347 Piscataway, USA.

G. Battail: "Polynomial description of linear block codes and its applications to soft–input, soft–output decoding" Ann. Telecommun., vol. 54, No. 3–4, Mar. 1999, pp. 148–165, XP000834637.

P.H. Siegel and J.K. Wolf: "Modulation and Coding for Information Storage" IEEE Communications Magazine, vol. 29, No. 12, Dec. 1991, pp. 68–86, XP000287983 New York.

S. Benedetto, D. Divsalar, G. Montorsi, F. Pollara: "Soft–Output Decoding Algorithms for Continuous Decoding of Parallel Concatenated Convolutional Codes" IEEE International Conference on Communications (ICC), Jun. 23, 1996, pp. 112–117, XP000625652 New York.

R.T. Lynch: "Channels and Codes for Magnetooptical Recording" IEEE Journal on Selected Areas in Communications, vol. 10, No. 1, 1992, pp. 57–72, XP000046206 New York.

E. Offer: Soft–In/Soft–Out Decoders for Linear Block Codes ITG FACHBERICHTE, Jan. 1, 1994, pp. 31–40, XP000503775 Berlin.

* cited by examiner

METHOD AND APPARATUS FOR REPRODUCING DATA AND METHOD AND APPARATUS FOR RECORDING AND/OR REPRODUCING DATA

BACKGROUND OF THE INVENTION

1. Field of the Invention

This invention relates to a method and apparatus for reproducing data recorded on a recording medium and a method and apparatus for recording and/or reproducing data for a recording medium.

2. Description of Related Art

As a recording medium for recording digital data, there are known a wide variety of recording mediums of the magnetic, optical or photomagnetic system, such as a hard disc, a so-called DVCR (digital video cassette recorder) or a so-called CD (Compact Disc), DVD (digital versatile disc) and a so-called MO (magneto-optical disc).

For recording signals on these recording mediums, physical processing needs to be performed on the recording mediums, such as by controlling the direction of magnetization by a write head for a recording medium of the magnetic recording system, or by forming pits of lengths corresponding to signals by a stamper for a recording medium of the optical recording system. In this case, in order to permit amplitude control of readout signals or clock reproduction on the reproducing side reading out the signals recorded on the recording medium to operate as normally, the signal recording side for recording signals on a recording medium routinely uses a system of modulation encoding the signal in a pre-set manner to record the resulting modulation-coded signal.

A modulation-coder, performing this modulation coding, routinely is fed with binary signals exempt from various limitations, and outputs binary signals free of various limitations. These limitations on the signals include DC free limitations which state that the numbers of "0"s and "1"s be equalized over a sufficient long length of the concatenations of "0"s and "1"s, and the (d, k) limitations which state that the minimum and maximum numbers of consecutive "0"s and "1"s in a code be d and k, respectively. FIG. 1 shows an input/output example in a modulation coder outputting a code satisfying the (d, k)=(2, 7) limitations. Specifically, a modulation coder 150, outputting a code satisfying the (d, k)=(2, 7) limitation, is shown in FIG. 1, by way of concrete explanation of the concept of the (d, k) limitations. That is, if an input signal, free of the limitation, is input to the modulation coder 150, outputting a code satisfying the (d, k)=(2, 7) limitation, modulation-encodes the input signal to generate and output an output signal in which the minimum and maximum numbers of consecutive "0"s are 2 and 7, respectively.

The above example indicates that, in converting a bit string free of a limitation is converted into another bit string subjected to a limitation, the total number of the output bits is larger than that of the input bits. If the total number of input bits is K and the total number of output bits is N, the ratio K/N is represented as a code rate R. This code rate R serves as an index indicating the efficiency of the modulation coding. If two or more modulation coders, generating output signals satisfying the same limitations, are compared to one another, a modulation coder having the high code rate R is able to encode more input bits for a given number of output bits than one having the low code rate R. Stated differently, a modulation coder having a high code rate R is able to record more information on a pre-set recording medium than one having a low code rate R.

The modulation coding may be classified into a block coding system in which input bits are divided into plural blocks of pre-set lengths and output bits generated are divided into plural blocks of pre-set lengths corresponding to the blocks of the input bits, and a variable length coding system, in which encoding units of input bits and output bits associated with the input bits are varied. For example, the so-called 8/9 code or the 16/17 code, routinely used for modulation coding, belong to the block coding system, whilst the so-called (1, 7) RLL code or the (2, 7) RLL code belong to the variable length encoding system.

For example, in a block modulation encoding system, fed with two bits as input bits, and generating three output bits satisfying the (d, k)=(0, 2) limitations, a modulation coder has a conversion table as Table 1:

TABLE 1

Example of Conversion Table

| input bits | output bits |
|---|---|
| 00 | 011 |
| 01 | 101 |
| 10 | 111 |
| 11 | 110 | stored in e.g., a memory, not shown. The modulation coder references this conversion table and finds, for each 2-bit input bits, an associated 3-bit output bits, with the output bits being issued as output sequentially.

On the other hand, a modulation decoder for modulating-decoding the modulation-coded signals has a back-conversion table, as Table 2:

TABLE 2

Example of Back-Conversion Table

| input bit | decoded bits |
|---|---|
| 000 | 01 |
| 001 | 00 |
| 010 | 10 |
| 011 | 00 |
| 100 | 11 |
| 101 | 01 |
| 110 | 11 |
| 111 | 10 | corresponding to the conversion table of Table 1, stored in e.g., a memory, not shown. The modulation decoder references this back-conversion table to find and sequentially output 2-bit decoded bits, associated with the 3-bit input bits.

FIG. 2 shows a typical modulation decoder 160 having at least a ROM (read-only memory) 161. The modulation decoder 160 is fed with an input address signal D 161 to output the contents stored in an address of the ROM 161 corresponding to this input address signal D161 as a demodulated decoded signal D162. In actuality, if the input bits are back-converted into decoded bits in accordance with the back-conversion table shown in Table 2, the contents of the decoded bits are stored in addresses of a ROM 161 of the modulation decoder 160, corresponding to the input bits in Table 2. The decoded bits, stored in these addresses, are read out by way of performing the back-conversion.

FIG. 3 shows a typical modulation decoder 170 at least having a combination circuit 171. The modulation decoder 170 is fed with an input signal D171 and executes logical operations on the input signal D171 by the combination circuit 171 to generate a modulated decoded signal D172. In actuality, if, in performing back conversion from the input bits to the decoded bits in accordance with the back-conversion table of Table 2, the three-bit input signal D171 is represented as ($a_0$, $a_1$, $a_2$) and a two-bit modulated decoded signal D172 is represented as ($b_0$, $b_1$), the modulation decoder 170 generates the output bits ($b_0$, $b_1$) by the combination circuit 171 corresponding to the following logical equations (1):

$$b_0 = (a_1 \& a_2) | (a_0 \& !a_1 \& !a_2) | (!a_0 \& a_1 \& !a_2)$$
$$b_1 = (a_0 \& !a_1) | (!a_0 \& !a_1 \& !a_2) | (a_0 \& a_1 \& !a_2) \qquad (1)$$

where |, & and ! indicate the logical sum, logical product and logical negation, respectively.

If the modulation coder and the modulation decoder are applied to a magnetic recording and/or reproducing apparatus for recording and/or reproducing data on or from a recording medium in accordance with the magnetic recording system, the recording and/or reproducing apparatus is configured as shown in FIG. 4.

That is, the magnetic recording and/or reproducing apparatus 200, shown in FIG. 4, includes, as a recording system for recording data on a recording medium 250, an error correction encoder 201 for error correction encoding input data, a modulation encoder 202 for modulation encoding the input data, a precoder 203 for filtering input data for compensating its channel characteristics, a write current driver 204 for converting respective bits of the input data into write current values, and a write head 205 for recording data on the recording medium 250. The magnetic recording and/or reproducing apparatus 200 also includes, as a playback system for reproducing data recorded on the recording medium 250, a readout head 206 for reading out data recording on the recording medium 250, an equalizer 207 for equalizing the input data, a gain adjustment circuit 208 for adjusting the gain of the input data, an analog/digital converter (A/D converter) 209 for converting analog data into digital data, a timing generating circuit 210 for generating clocks, a gain adjustment control circuit 211 for controlling the gain adjustment circuit 208, a viterbi decoder 212 for viterbi-decoding the input data, a modulation decoder 213 for modulation decoding the input data and an error correction decoder 214 for error correction decoding the input data.

In recording data on the recording medium 250, the magnetic recording and/or reproducing apparatus 200 performs the following operations:

When fed with the input data D201, the magnetic recording and/or reproducing apparatus 200 applies error correction coding to the input data D201, by the error correction encoder 201, to generate error correction encoded data D202.

The magnetic recording and/or reproducing apparatus 200 modulation encodes the error correction encoded data D202 from the error correction encoder 201, by the modulation encoder 202, to generate modulation-encoded data D203, which is a string of bits subjected to limitations.

The magnetic recording and/or reproducing apparatus 200 performs filtering on the modulation-encoded data D203, supplied from the modulation encoder 202, by the precoder 203, in such a manner as to compensate for the channel characteristics as from the writing of data on the recording medium 250 up to outputting thereof at an equalizer 207 in the reproducing system, to generate a precode signal D204.

For example, if the channel has 1–D characteristics, the precoder 203 performs the filtering F indicated by the following equation (2):

$$F = 1/(1 \oplus D) \qquad (2)$$

where $\oplus$ denotes exclusive-OR.

The magnetic recording and/or reproducing apparatus 200 then converts respective bits of the precode signal D204, as binary signal supplied from the precoder 203, by a write current driver 204, into write current values Is, such as by $0 \rightarrow -I_S$, $1 \rightarrow +I_S$, to generate a write current signal D205.

By the write head 205, the magnetic recording and/or reproducing apparatus 200 applies a write magnetization signal D206, corresponding to the write current signal D205 supplied from the write current driver 204, to the recording medium 250.

By the above processing, the magnetic recording and/or reproducing apparatus 200 is able to record data on the recording medium 250.

In reproducing the data recorded on the recording medium 250, the magnetic recording and/or reproducing apparatus 200 performs the following processing:

First, the magnetic recording and/or reproducing apparatus 200 reads out the readout magnetization signal D207 from the recording medium 250 by the readout head 206 to generate a readout current signal D208 conforming to this readout magnetization signal D207.

The magnetic recording and/or reproducing apparatus 200 then equalizes the readout current signal D208, supplied from the readout head 206, by the equalizer 207, so that the channel response since data writing on the recording medium 250 in the recording system until outputting thereof at the equalizer 207 will be of pre-set characteristics, such as 1–D, to generate an equalized signal D209.

The magnetic recording and/or reproducing apparatus 200 then adjusts the gain of the equalized signal D209, supplied from the equalizer 207, by the gain adjustment circuit 208, based on a gain adjustment control signal D213 from the gain adjustment control circuit 211, to generate a gain adjustment signal D210. Meanwhile, the gain adjustment control signal D213 is generated by the gain adjustment control circuit 211, based on the digital channel signal D211, as later explained. Specifically, the gain adjustment control signal D213 is a control signal for maintaining the amplitude of the equalization signal D209 at an expected value.

By the A/D converter 209, the magnetic recording and/or reproducing apparatus 200 digitizes the gain adjustment signal D210, supplied from the gain adjustment circuit 208, to generate the digital channel signal D211. Meanwhile, the A/D converter 209 performs sampling based on the clock signal D212 generated and supplied by the timing generating circuit 210. The timing generating circuit 210, fed with the digital channel signal D211, generates clocks to produce clock signals D212 which are output to the A/D converter 209.

The magnetic recording and/or reproducing apparatus 200 feeds the digital channel signal D211, supplied from the A/D converter 209, to the viterbi decoder 212, which then performs viterbi decoding on the channel response from the upstream side of the precoder 203 in the recording system up to the outputting at the equalizer 207 in the reproducing system, for example, the channel response $R_{ch}$ represented by the following equation (3):

$$R_{ch} = (1-D)/(1 \oplus D) \qquad (3)$$

where $\oplus$ denotes Exclusive-OR.

The magnetic recording and/or reproducing apparatus 200 then applies modulation decoding on the viterbi decoded signal D214, supplied from the modulation decoder 213, to realize data correspondence reversed from that in the modulation encoder 202 in the recording system to generate a modulated decoded signal D215 which is an original input data string not subjected to limitations.

The magnetic recording and/or reproducing apparatus 200 decodes the error correction codes of the modulated decoded signal D215, supplied from the modulation decoder 213, by the error correction decoder 214, to generate output data D216.

By the above processing, the magnetic recording and/or reproducing apparatus 200 is able to reproduce the data recorded on the recording medium 250.

Meanwhile, in the above-described conventional magnetic recording and/or reproducing apparatus 200, the modulation decoder 213 has no more than the function of realizing the correspondence between binary signals reversed from that obtained on modulation encoding by the modulation encoder 202, while the signals in both the input and the output of the modulation decoder 213 needs to be binary signals, with the result that the signals on the downstream side of the viterbi decoder 212 are all binary signals.

In other words, it is necessary in the magnetic recording and/or reproducing apparatus 200 to generate binary signals on the upstream side of the modulation decoder 213 and to process the binary signals even on the downstream side of the modulation decoder 213.

Thus, in the magnetic recording and/or reproducing apparatus 200, in which bi-level binary signals need to be used, the information volume in the signal is diminished intentionally with the result that efficient decoding cannot be realized to deteriorate the decoding error rate.

SUMMARY OF THE INVENTION

It is therefore an object of the present invention to provide a method and apparatus for reproducing data recorded on a recording medium and a method and apparatus for recording and/or reproducing data for a recording medium, whereby decoding may be performed efficiently to lower the decoding error rate.

In one aspect, the present invention provides a data reproducing apparatus for reproducing data recorded on a recording medium including modulation decoding means for modulation decoding data modulation-encoded in a predetermined fashion by modulation encoding means provided on a recording equipment adapted for recording data on the recording medium, in which the modulation decoding means is fed with a soft input signal and outputs a soft output signal.

This data reproducing apparatus modulation-decodes the data modulation-encoded by soft input soft output type modulation decoding means.

In another aspect, the present invention provides a data reproducing method for reproducing data recorded on a recording medium including a modulation decoding step of modulation decoding data modulation-encoded in a predetermined fashion by a modulation encoding step for recording data on the recording medium, in which the modulation decoding step is fed with a soft input signal and outputs a soft output signal.

This data reproducing method modulation-decodes the data modulation-encoded by a soft input soft output type modulation decoding step.

In still another aspect, the present invention provides a data recording and reproducing apparatus for recording and reproducing data for a recording medium, including modulation encoding means, as a recording system for recording data on the recording medium, for performing predetermined modulation encoding on the data in recording the data on the recording medium, and modulation decoding means, as a reproducing system for reproducing the data recorded on the recording medium, for modulation-decoding data modulation-encoded by the predetermined modulation encoding by the modulation encoding means, in which the modulation decoding means is fed with a soft input signal and outputs a soft output signal.

This data reproducing apparatus modulation-decodes data modulation-encoded by modulation encoding means by soft input soft output type modulation decoding means.

In yet another aspect, the present invention provides a data recording and reproducing method for recording and reproducing data for a recording medium, including a modulation encoding step of performing predetermined modulation encoding on data recorded on the recording medium, as a recording system for recording data on the recording medium, and a modulation decoding step of modulation encoding data modulation-encoded by the predetermined modulation encoding step, as a reproducing system for reproducing data recorded on the recording medium, in which the modulation decoding step is fed with a soft input signal and outputs a soft output signal.

In this data reproducing method, a soft input signal is fed and a soft output signal is issued in modulation-decoding data modulation-encoded by a modulation encoding step.

The data reproducing apparatus for reproducing data recorded on a recording medium according to the present invention includes modulation decoding means for modulation decoding data modulation-encoded in a predetermined fashion by modulation encoding means provided on a recording equipment, configured for recording data on the recording medium. The modulation decoding means is fed with a soft input signal and outputs a soft output signal.

So, with the data reproducing apparatus according to the present invention, in which data modulation encoded in a predetermined fashion is modulation-decoded by soft input soft output modulation decoding means, efficient decoding exploiting the soft information may be realized, thereby lowering the decoding error rate.

The data reproducing method for reproducing data recorded on a recording medium according to the present invention includes a modulation decoding step of modulation decoding data modulation-encoded in a predetermined fashion in a modulation encoding step of recording data on the recording medium. The modulation decoding step is fed with a soft input signal and outputs a soft output signal.

So, with the data reproducing method according to the present invention, a soft input signal is input and a soft output signal is output in modulation-decoding data modulation-encoded in the modulation decoding step to effect efficient decoding exploiting the soft information to lower the decoding error rate.

The data recording and reproducing apparatus for recording and reproducing data for a recording medium according to the present invention includes modulation encoding means, as a recording system for recording data on the recording medium, for performing predetermined modulation encoding on the data in recording the data on the recording medium, and modulation decoding means, as a reproducing system for reproducing the data recorded on the recording medium, for modulation-decoding data modulation-encoded by the predetermined modulation encoding by the modulation encoding means. The modulation decoding means is fed with a soft input signal and outputs a soft output signal.

So, in the data recording and reproducing apparatus according to the present invention, in which, in modulation decoding data modulation, encoded in a predetermined fashion by the modulation encoding means, by soft input soft output modulation decoding means, efficient decoding exploiting the soft information can be achieved thereby lowering the decoding error rate.

The data recording and reproducing method for recording and reproducing data for a recording medium according to the present invention includes a modulation encoding step for performing predetermined modulation encoding on the data in recording the data on the recording medium, as a recording system for recording data on the recording medium, and a modulation decoding step for modulation decoding the data modulation-encoded by the predetermined modulation encoding step, as a reproducing system for reproducing data recorded on the recording medium. The modulation decoding step is fed with a soft input signal and outputs a soft output signal.

So, in the data recording and reproducing method, according to the present invention, a soft input signal is input and a soft output signal is output in modulation decoding data modulation-encoded in the modulation decoding step to enable efficient decoding using the soft information thus lowering the decoding error rate.

DESCRIPTION OF THE PREFERRED EMBODIMENTS

Figure 1:
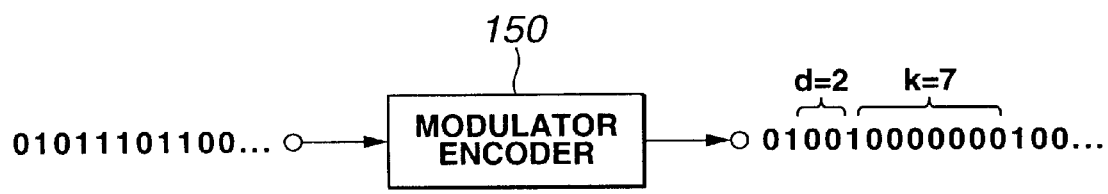
FIG. 1 illustrates an input/output example of a conventional modulation encoder.
Figure 2:
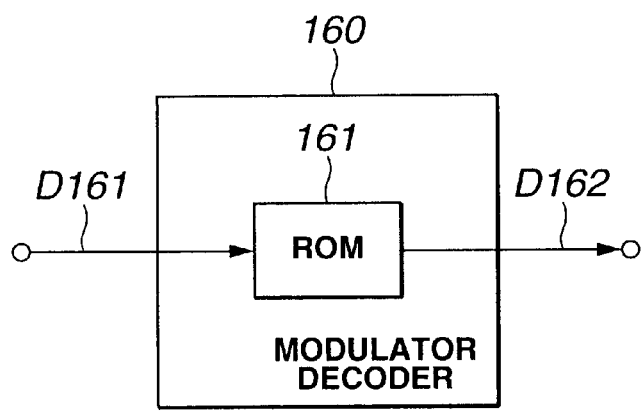
FIG. 2 is a block diagram showing the structure of a conventional modulation decoder.
Figure 3:
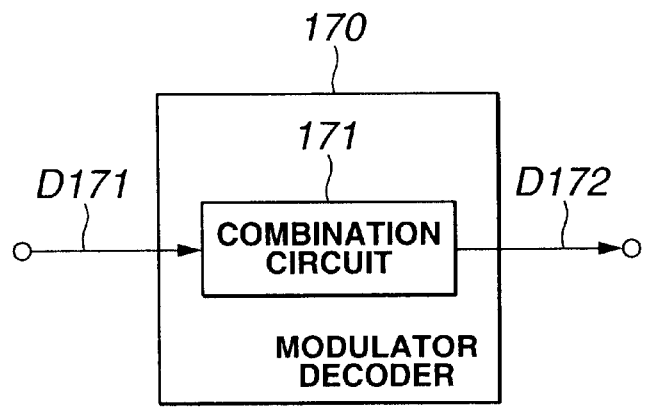
FIG. 3 is a block diagram showing the structure of another conventional modulation decoder.
Figure 4:
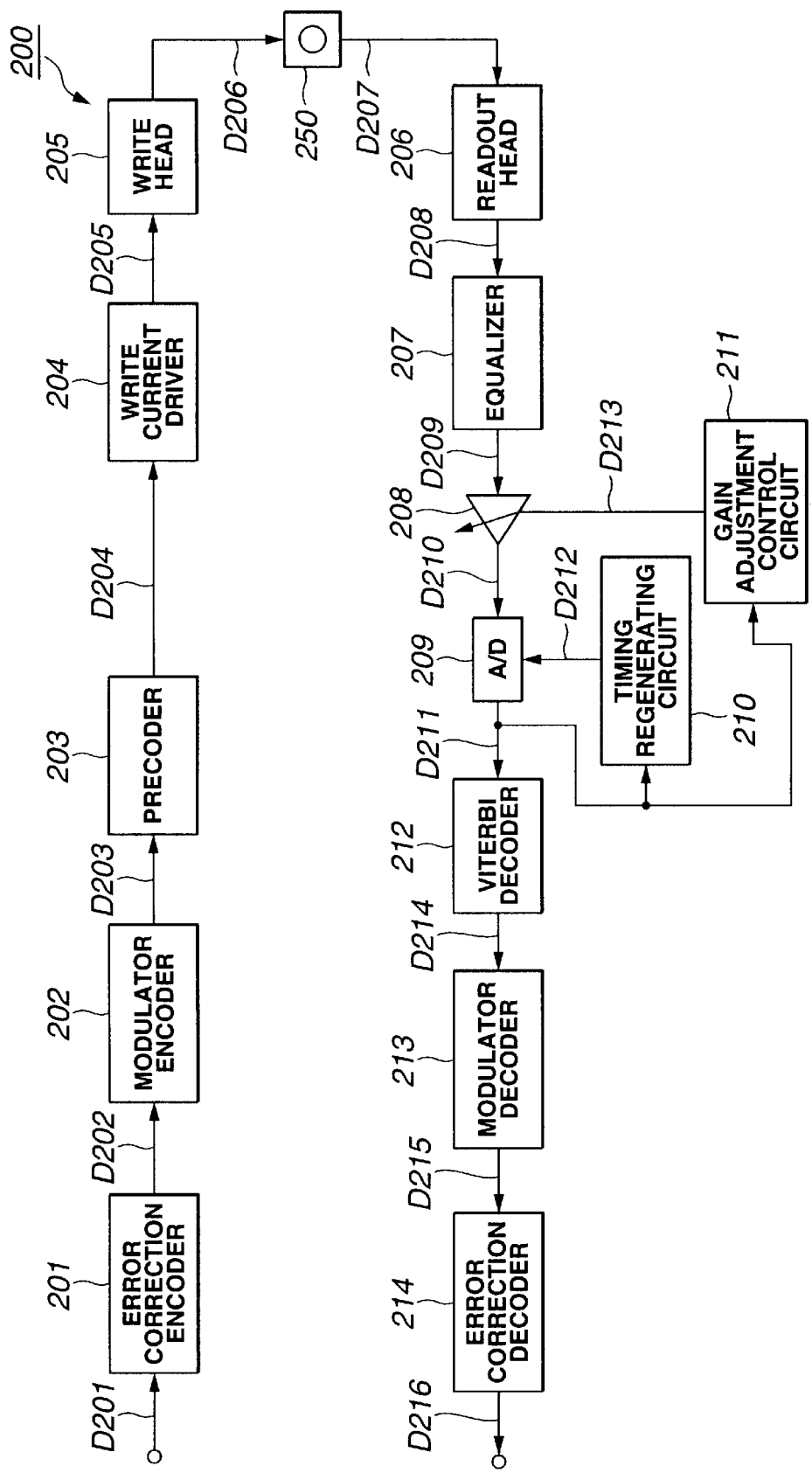
FIG. 4 is a block diagram showing the structure of a conventional magnetic recording and/or reproducing apparatus.

Referring to the drawings, preferred embodiments of the present invention will be explained in detail.

The present embodiment is directed to a magnetic recording and/or reproducing apparatus made up of a recording system for recording data on a recording medium of the magnetic recording system, such as a hard disc or a so-called DVCR (digital video cassette recorder), and a reproducing system for reproducing data recorded on these recording mediums.

This magnetic recording and/or reproducing apparatus uses a modulation decoder of the soft input soft output type (SISO type), as a modulation decoder for modulating and decoding modulation encoded signals, which is fed with data as soft input and which outputs data as soft output.

First, a magnetic recording and/or reproducing apparatus of a first embodiment is explained. Here, the SISO type modulation decoder, as modulation decoding means applied to the reproducing system of this magnetic recording and/or reproducing apparatus, is explained by referring to FIGS. 5 and 6.

Figure 5:
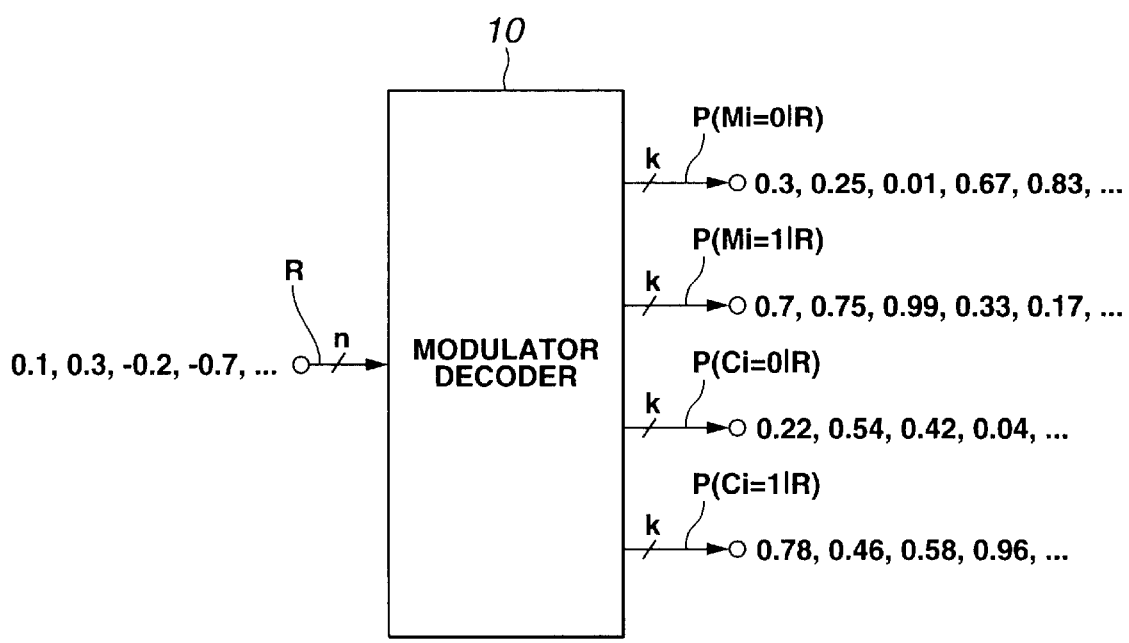
FIG. 5 illustrates an input/output example in a modulation decoder applied to a reproducing system of a magnetic recording and/or reproducing apparatus shown as a first embodiment of the present invention.

A modulation decoder 10, shown in FIG. 5, decodes data encoded by block modulation, with the code rate R=k/n, where k is the number of input bits and n is the number of bits for modulation coding.

When fed with a reception signal R as the soft input, the modulation decoder 10 calculates the probability $P(R_i=0|R)$ that the respective bits of this reception signal R be "0" and the probability $P(R_i=1|R)$ that the respective bits of this reception signal R be "1". Ultimately, the modulation decoder 10 calculates a posterior probability information $P(Mi=0|R)$ and $P(Mi=1|R)$, as a soft decision value for a modulation code block M represented by $M=(M_0, M_1, \ldots, M_{n-1})$, and/or a posterior probability information $P(C_i=0|R)$ and $P(C_i=1|R)$, as a soft decision value for a modulation code input block C represented by $C=(C_0, C_1, \ldots, C_{k-1})$, to output the so-calculated information.

Instead of individually outputting the aforementioned posterior probability information, the modulation decoder is also able to output the logarithmic value of the ratio of the posterior probability information, that is $\log(P(M_i=1|R)/P(M_i=0|R))$ or $\log(P(C_i=1|R)/P(C_i=0|R))$. These log values are routinely termed log likelihood ratio and here denote the likelihood of the modulating code block M and the modulating code input block C on the occasion of inputting the reception signal R.

The modulation decoder may also be fed with the priori probability information $P(C_i=0)$ and $P(C_i=1)$ for a modulation code input block C, instead of being fed with the aforementioned reception signal R.

Figure 6:
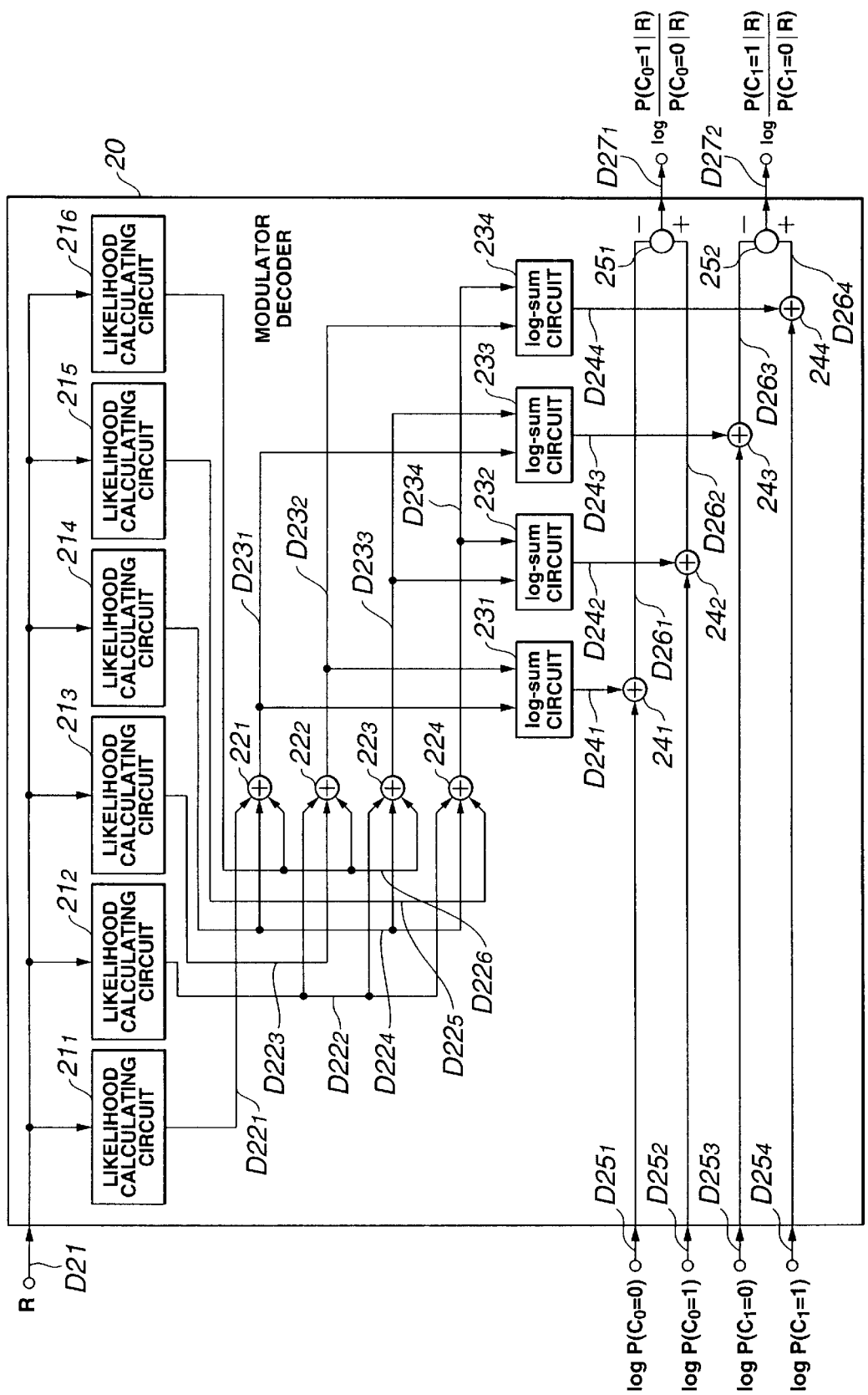
FIG. 6 is a block diagram showing the structure of a mediation decoder applied to a reproducing system of the magnetic recording and/or reproducing apparatus shown in FIG. 5.

Specifically, the modulation decoder may, for example, be configured as shown in FIG. 6. In the following explanation, it is assumed that, for generating a three-bit output for a two-bit input, data to be decoded has been encoded in accordance with the conversion table shown in the following Table 3:

TABLE 3

| Example of Conversion Table | |
|---|---|
| input bits | output bits |
| 00 | 011 |
| 01 | 101 |

TABLE 3-continued

Example of Conversion Table

| input bits | output bits |
|---|---|
| 10 | 111 |
| 11 | 110 |

The modulation decoder 20, shown in FIG. 6, includes six likelihood calculating circuits $21_1$, $21_2$, $21_3$, $21_4$, $21_5$ and $21_6$, as means for calculating the likelihood of each reception bit, four adders $22_1$, $22_2$, $22_3$ and $22_4$ for summing the data, four log-sum circuits $23_1$, $23_2$, $23_3$ and $23_4$ for performing the operations of log ($e^A + e^B$) on the two data A and B, four adders $24_1$, $24_2$, $24_3$ and $24_4$ for summing two data and two comparators $25_1$, $25_2$ for taking the ratio of the two data. It is noted that the number six of the likelihood calculating circuits is derived from three bits multiplied by 2 equals to six bits.

The likelihood calculating circuits $21_1$, $21_2$, $21_3$, $21_4$, $21_5$ and $21_6$ are respectively fed with respective reception bits in a reception signal D21 (R) to calculate the likelihood of the respective reception bits.

That is, the likelihood calculating circuits 211 is fed with the 0th bit of the three-bit reception signal D21 to calculate the log probability value $D22_1$(logP($R_0$=0|R)) corresponding to the log value of the probability that this bit is "0". The likelihood calculating circuits $21_1$ sends the generated log probability value $D22_1$ to the adder $22_1$.

The likelihood calculating circuits $21_2$ is fed the 0th bit of the three-bit reception signal D21 to calculate the log probability value $D22_2$(logP($R_0$=1|R)) corresponding to the log value of the probability that this bit is "1". The likelihood calculating circuits $21_2$ sends the generated log probability value $D22_2$ to the adders $22_2$, $22_3$ and $22_4$.

Then, the likelihood calculating circuits $21_3$ is fed with the first bit of the three-bit reception signal D21 to calculate the log probability value $D22_3$ (logP($R_1$=0|R)) corresponding to the log value of the probability that this bit is "0". The likelihood calculating circuits $21_3$ sends the generated log probability value $D22_3$ to the adder $22_2$.

The likelihood calculating circuits $21_4$ is fed the first bit of the three-bit reception signal D21 to calculate the log probability value $D22_4$ (logP($R_1$=1|R)) corresponding to the log value of the probability that this bit is "1". The likelihood calculating circuits $21_4$ sends the generated log probability value $D22_4$ to the adder $22_1$, $22_3$ and $22_4$.

Then, the likelihood calculating circuits $21_5$ is fed with the second bit of the three-bit reception signal D21 to calculate the log probability value $D22_5$(logP($R_2$=0|R)) corresponding to the log value of the probability that this bit is "0". The likelihood calculating circuits $21_5$ sends the generated log probability value $D22_5$ to the adder $22_4$.

The likelihood calculating circuits $21_6$ is fed the second bit of the three-bit reception signal D21 to calculate the log probability value $D22_6$(logP($R_2$=1|R)) corresponding to the log value of the probability that this bit is "1". The likelihood calculating circuits $21_6$ sends the generated log probability value $D22_6$ to the adders $22_1$, $22_2$ and $22_3$.

The adder $D22_1$ sums the log probability value $D22_1$, supplied from the likelihood calculating circuits $21_1$, the log probability value $D22_4$, supplied from the likelihood calculating circuits $21_4$ and the log probability value $D22_6$, supplied from the likelihood calculating circuits $21_6$ to generate the likelihood value $D23_1$. That is, this likelihood value $D23_1$ is not other than the probability represented by log P(R|$M_0M_1M_2$=011). The adder $D22_1$ sends the generated likelihood value $D23_1$ to the log-sum circuits $23_1$, $23_3$.

The adder $D22_2$ sums the log probability value $D22_2$, supplied from the likelihood calculating circuits $21_2$, the log probability value $D22_3$, supplied from the likelihood calculating circuits $21_3$ and the log probability value $D22_6$, supplied from the likelihood calculating circuits $21_6$ to generate the likelihood value $D23_2$. That is, this likelihood value $D23_2$ is not other than the probability represented by log P(R|$M_0M_1M_2$=101). The adder $D22_2$ sends the generated likelihood value $D23_2$ to the log-sum circuits $23_1$, $23_4$.

The adder $D22_3$ sums the log probability value $D22_2$, supplied from the likelihood calculating circuits $21_2$, the log probability value $D22_4$, supplied from the likelihood calculating circuits $21_4$ and the log probability value $D22_6$, supplied from the likelihood calculating circuits $21_6$ to generate the likelihood value $D23_3$. That is, this likelihood value $D23_3$ is not other than the probability represented by log P(R|$M_0M_1M_2$=111). The adder $D22_3$ sends the generated likelihood value $D23_3$ to the log-sum circuits $23_2$, $23_3$.

The adder $D22_4$ sums the log probability value $D22_2$, supplied from the likelihood calculating circuits $21_2$, the log probability value $D22_4$, supplied from the likelihood calculating circuits $21_4$ and the log probability value $D22_5$, supplied from the likelihood calculating circuits $21_5$ to generate the likelihood value $D23_4$. That is, this likelihood value $D23_4$ is not other than the probability represented by log P(R|$M_0M_1M_2$=110). The adder $D22_4$ sends the generated likelihood value $D23_4$ to the log-sum circuits $23_2$, $23_4$.

The log-sum circuit $23_1$ performs an operation shown by the equation (4):

$$log(e^{logP(R|M_0M_1M_2=011)} + e^{logP(R|M_0M_1M_2=101)}) = log(P(R|M_0M_1M_2=011) + P(R|M_0M_1M_2=101)) \quad (4)$$

on the likelihood value $D23_1$ supplied from the adder $22_1$ and on the likelihood value $D23_2$ supplied from the adder $22_2$ to generate a likelihood value $D24_1$. The log-sum circuit $23_1$ sends the so-generated likelihood value $D24_1$ to the adder $24_1$.

The log-sum circuit $23_2$ performs an operation shown by the equation (5):

$$log(e^{logP(R|M_0M_1M_2=111)} + e^{logP(R|M_0M_1M_2=110)}) = log(P(R|M_0M_1M_2=111) + P(R|M_0M_1M_2=110)) \quad (5)$$

on the likelihood value $D23_3$ supplied from the adder $22_3$ and on the likelihood value $D23_4$ supplied from the adder $22_4$ to generate a likelihood value $D24_2$. The log-sum circuit $23_2$ sends the so-generated likelihood value $D24_2$ to the adder $24_2$.

The log-sum circuit $23_3$ performs an operation shown by the equation (6):

$$log(e^{logP(R|M_0M_1M_2=011)} + e^{logP(R|M_0M_1M_2=111)}) = log(P(R|M_0M_1M_2=011) + P(R|M_0M_1M_2=111)) \quad (6)$$

on the likelihood value $D23_1$ supplied from the adder $22_1$ and on the likelihood value $D23_3$ supplied from the adder $22_3$ to generate a likelihood value $D24_3$. The log-sum circuit $23_3$ sends the so-generated likelihood value $D24_3$ to the adder $24_3$.

The log-sum circuit $23_4$ performs an operation shown by the equation (7):

$$log(e^{logP(R|M_0M_1M_2=101)} + e^{logP(R|M_0M_1M_2=110)}) = log(P(R|M_0M_1M_2=101) + P(R|M_0M_1M_2=110)) \quad (7)$$

on the likelihood value $D23_2$ supplied from the adder $22_2$ and on the likelihood value $D23_4$ supplied from the adder $22_4$ to generate a likelihood value $D24_4$. The log-sum circuit $23_4$ sends the so-generated likelihood value $D24_4$ to the adder $24_4$.

The adder $24_1$ sums the likelihood value $D23_1$ supplied from the log-sum circuit $23_1$ and the log priori probability $D25_1(\log P(C_0=0))$ for an input bit, fed from outside, to generate the log probability value $D26_1$. This log probability value $D26_1$ denotes the probability shown by the following equation (8):

$$\log P(C_0=0|R)=\log\{P(R|M_0M_1M_2=011)+(R|M_0M_1M_2=101)\}+\log P(C_0=0) \quad (8)$$

The adder $24_1$ sends the generated log probability value $D26_1$ to a comparator $25_1$.

The adder $24_2$ suns the likelihood value $D24_2$ supplied from the log-sum circuit $23_2$ and the log priori probability $D25_2$ ($\log P(C_0=1)$) for an input bit, input from outside, to generate the log probability value $D26_2$. This log probability value $D26_2$ denotes the probability shown by the following equation (9):

$$\log P(C_0=0|R)=\log\{P(R|M_0M_1M_2=111)+(R|M_0M_1M_2=110)\}+\log P(C_0=0) \quad (9).$$

The adder $24_2$ sends the generated log probability value $D26_2$ to a comparator $25_1$.

The adder $24_3$ sums the likelihood value $D24_3$ supplied from the log-sum circuit $23_3$ and the log priori probability $D25_3$ ($\log P(C_1=0)$) for an input bit, input from outside, to generate the log probability value $D26_3$. This log probability value $D26_3$ denotes the probability shown by the following equation (10):

$$\log P(C_0=0|R)=\log\{P(R|M_0M_1M_2=011)+(R|M_0M_1M_2=111)\}+\log P(C_0=0) \quad (10)$$

The adder $24_3$ sends the generated log probability value $D26_3$ to a comparator $25_2$.

The adder $24_4$ sums the likelihood value $D24_4$ supplied from the log-sum circuit $23_4$ and the log priori probability $D25_4$ ($\log P(C_1=1)$) for an input bit, input from outside, to generate the log probability value $D26_4$. This log probability value $D26_4$ denotes the probability shown by the following equation (11):

$$\log P(C_0=0|R)=\log\{P(R|M_0M_1M_2=101)+(R|M_0M_1M_2=110)\}+\log P(C_0=0) \quad (11)$$

The adder $24_4$ sends the generated log probability value $D26_4$ to a comparator $25_2$.

The comparator $25_1$ takes the ratio of the log probability value $D26_1$ supplied from the adder $24_1$ and the log probability value $D26_2$ supplied from the adder $24_2$ to generate the decoded log posterior probability ratio $D27_1$ ($\log(P(C_0=1|R)/P(C_0=0|R))$) which is output.

The comparator $25_2$ takes the ratio of the log probability value $D26_3$ supplied from the adder $24_3$ and the log probability value $D26_4$ supplied from the adder $24_4$ to generate the decoded log posterior probability ratio $D27_2$ ($\log(P(C_1=1|R)/P(C_1=0|R))$) which is output.

The modulation decoder 20, having the components as described above, has the likelihood calculating circuits $21_1$, $21_2$, $21_3$, $21_4$, $21_5$ and $21_6$ for calculating the likelihood of respective reception bits in the reception signals $D21(R)$ taking analog values under the effect of the noise generated in the course of transmission, as soft input, that is the respective output codewords on the modulation coder side. By these likelihood calculating circuits $21_1$, $21_2$, $21_3$, $21_4$, $21_5$ and $21_6$, the modulation decoder 20 finds the likelihood of the respective codewords and uses the likelihood values, thus found, to find the posterior probability information straightforwardly, as soft decision values for the input and output bits on the modulation coder side.

Meanwhile, the modulation decoder 20 is fed from outside with log priori probability $D25_1$, $D25_2$, $D25_3$, $D25_4$. If the probability of the respective bits making up the binary signal input to the modulation coder, not shown, being "0", is equivalent to the same probability being "1", there is no necessity of inputting the log priori probability $D25_1$, $D25_2$, $D25_3$, $D25_4$, it being only necessary to handle as if the values of these log priori probability $D25_1$, $D25_2$, $D25_3$, $D25_4$ are all equal to zero.

Although the above explanation is based on the assumption that the modulation decoder 20 decodes data obtained on modulation-coding a 2-bit input to a 3-bit output, the modulation decoder is not limited as to the number of bits of the input or the output and may be similarly configured in keeping with the number of bits of the input or the output used.

Figure 7:
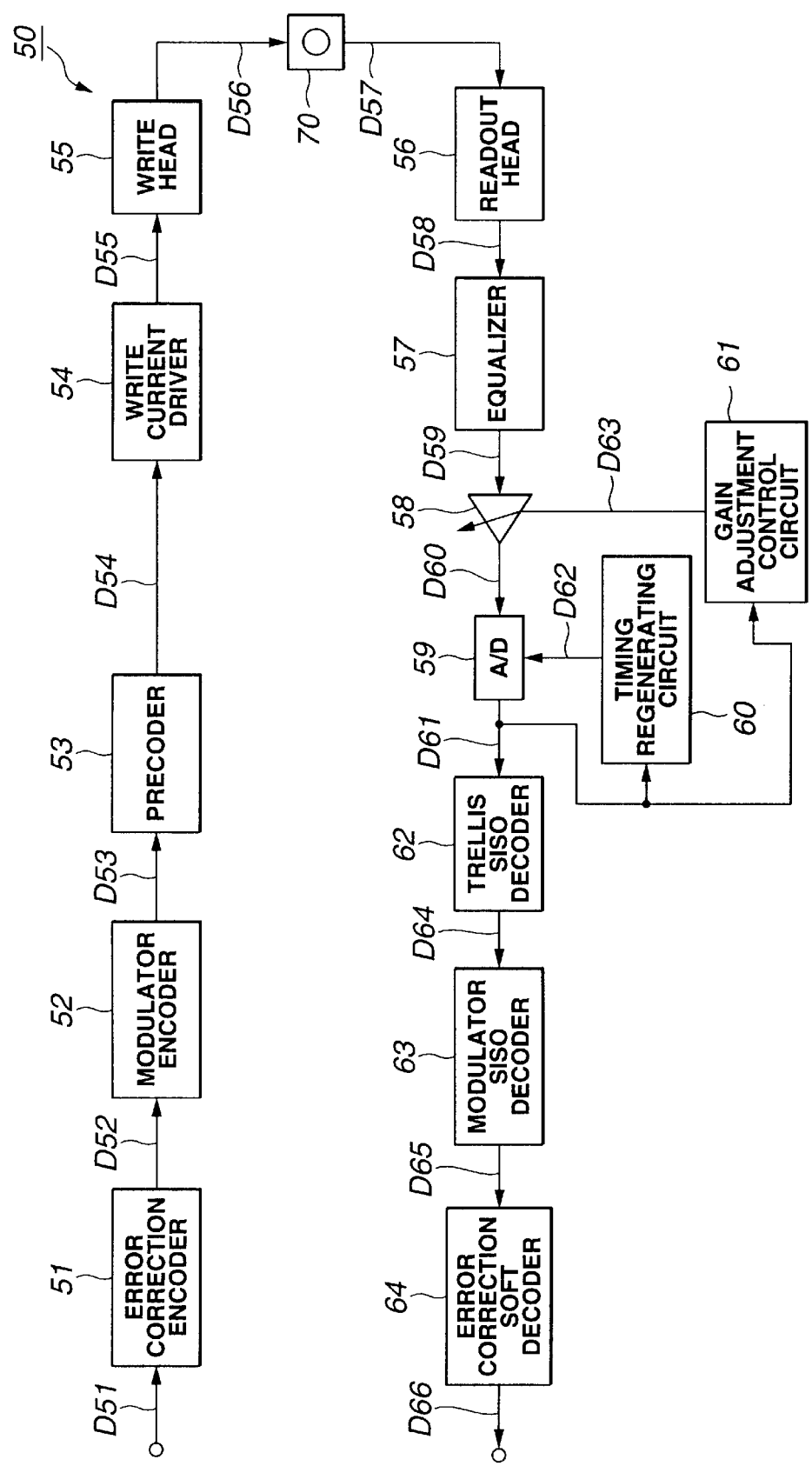
FIG. 7 is a block diagram for illustrating the structure of the magnetic recording and/or reproducing apparatus shown in FIG. 5.

Referring to FIG. 7, the magnetic recording and/or reproducing apparatus, employing this modulation decoder, is hereinafter explained.

A magnetic recording and/or reproducing apparatus 50, shown in FIG. 7, includes, as a recording system for recording data on a recording medium 70, an error correction coder 51 for error correction coding input data, a modulation coder 52 for modulation coding input data, a precoder 53 for filtering the input data for compensating for channel characteristics, a write current driver 54 for converting respective bits of the input data into write current values, and a write head 55 for recording data on a recording medium 70. The magnetic recording and/or reproducing apparatus 50 also includes, as a reproducing system for reproducing data recorded on the recording medium 70, an equalizer 57 for equalizing the input data, a gain adjustment circuit 58 for adjusting the gain of the input data, an analog/digital converter (A/D converter) 59 for converting analog data into digital data, a timing regenerating circuit 60 for regenerating clocks, a gain adjustment control circuit 61, a trellis SISO decoder 62, as a SISO type decoder for trellis-decoding input data, a modulation SISO decoder 63, as a SISO type decoder for modulation decoding input data and an error correction soft decoder 64 for error correction soft decoding input data.

The error correction coder 51 in the recording system error correction encodes input data D51. The error correction coder 51 routes error correction encoded data D52, generated on error correction coding, to a downstream side modulation coder 52.

The modulation coder 52, as the modulation encoding means, modulation-encodes the error correction encoded data D52, supplied from the error correction coder 51, to generate modulation coded data D53 as a string subjected to limitations. The modulation coder 52 routes the generated modulation coded data D53 to the downstream side precoder 53.

The precoder 53 filters the modulation coded data D53, supplied from the modulation coder 52, in such a manner as to compensate for channel characteristics from the data writing to the recording medium 70 to the outputting thereof in the equalizer 57 in the reproducing system, thereby generating a precode signal D54 as a binary signal. For example, the precoder 53 performs filtering F represented by the following equation (12):

$$F=1/(1 \oplus D) \quad (12)$$

if the channel of the precoder has 1−D characteristics. In the above equation, ⊕ denotes exclusive-OR. The precoder 53 sends the generated precede signal D54 to the downstream side write current driver 54.

The write current driver 54 converts respective bits of the precode signal D54, supplied from the precoder 53, into the write current value $I_S$, so that 0 and 1 will be converted to $-I_S$ and $+I_S (0 \to -I_S, 1 \to +I_S)$, respectively, to generate a write current signal D55. The write current driver 54 sends the so-generated write current signal D55 to the downstream side write head 55.

The write head 55 routes a write magnetization signal D56, conforming to the write current signal D55, supplied from the write current driver 54, to the recording medium 70 to record data thereon.

A readout head 56 in the reproducing system reads out the readout magnetization signal D57 from the recording medium 70 to generate a readout current signal D58 conforming to the readout magnetization signal D57. The readout head 56 sends the so-generated current signal D58 to the downstream side equalizer 57.

The equalizer 57 equalizes the current signal D58, supplied from the readout head 56, so that the channel response from the data writing on the recording medium 70 in the recording system up to the outputting at the equalizer 57 will be of pre-set characteristics, such as the 1−D, to generate an equalized signal D59. The equalizer 57 routes the generated equalized signal D59 to the downstream side gain adjustment circuit 58.

Based on a gain adjustment control signal D63, supplied from the gain adjustment control circuit 61, the gain adjustment circuit 58 adjusts the gain of the equalized signal D59 supplied from the equalizer 57, to generate a gain adjustment signal D60. The gain adjustment circuit 58 routes the generated gain adjustment signal D60 to the downstream side A/D converter 59.

Based on the clock signal D62, supplied from the timing regenerating circuit 60, the A/D converter 59 samples and digitizes the gain adjustment signal D60, supplied from the gain adjustment circuit 58, to generate a digital channel signal D61. The A/D converter 59 sends the generated digital channel signal D61 to the timing regenerating circuit 60, gain adjustment control circuit 61 and to the trellis SISO decoder 62.

The timing regenerating circuit 60 regenerates clocks from the digital channel signal D61 supplied from the A/D converter 59 to generate clock signals D62. The timing regenerating circuit 60 sends the generated clock signals D62 to the A/D converter 59.

Based on the digital channel signal D61, supplied from the A/D converter 59, the gain adjustment control circuit 61 generates a gain adjustment control signal D63, which is a control signal used for maintaining the amplitude of the equalized signal D59 at an expected value. The gain adjustment control circuit 61 sends the generated gain adjustment control signal D63 to the gain adjustment circuit 58.

The trellis SISO decoder 62, as trellis decoding means, is fed from the A/D converter 59 with the digital channel signal D61, supplied from the A/D converter 59, to perform soft output decoding, based on the so-called BCJR (Bahl, Cocke, Jelinek and Raviv) algorithm or on the SOVA (Soft Output Viterbi Algorithm) algorithm, in accordance with the trellis corresponding to the channel response from the pre-stage of the precoder 53 in the recording system up to the outputting at the equalizer 57, for example, the channel response $R_{ch}$ represented by the following equation (13):

$$R_{ch}(1-D)/(1 \oplus D) \quad (13)$$

where $\oplus$ denotes exclusive-OR, to generate a trellis soft output signal D64. The trellis SISO decoder 62 routes the generated trellis soft output signal D64 to the downstream side modulation SISO decoder 63.

The modulation SISO decoder 63, as modulation decoding means, constructed as the aforementioned modulation decoders 10, 20, is an SISO type modulation decoder. The modulation SISO decoder 63, fed with the trellis soft output signal D64 from the trellis SISO decoder 62, calculates a soft decision value for the error correction coded data D52, input to the modulation coder 52 in the recording system, to generate a modulated soft decision signal D65. This modulated soft decision signal D65 corresponds to the decoded log posterior probability ratio $D27_1$, $D27_2$, represented by the above-mentioned log likelihood ratio. The modulation SISO decoder 63 sends the so-generated modulated soft decision signal D65 to a downstream side error correction soft decoder 64.

The error correction soft decoder 64, as error correction soft decoding means, soft-decodes the modulated soft decision signal D65 from the modulation SISO decoder 63 for error correction codes, which are based on the aforementioned BCJR or SOVA algorithm, to output the soft-decoded signals to outside as output data D66 of the soft or hard output.

In recording data on the recording medium 70, the magnetic recording and/or reproducing apparatus 50 is able to record the precode signal D54, generated through the error correction coder 51, modulation encoder 52 and the precoder 53, on the recording medium 70, through the write current driver 54 and the write head 55.

In reproducing the data recorded on the recording medium 70, the magnetic recording and/or reproducing apparatus 50 soft-output-decodes the digital channel signal D61, as a soft input generated by the readout head 56, equalizer 57, gain adjustment circuit 58 and the A/D converter 59, by the trellis SISO decoder 62, to generate the trellis soft output signal D64. The trellis soft output signal D64 corresponds to the modulation coded data D53 as an output of the modulation coder 52 of the recording system.

The magnetic recording and/or reproducing apparatus 50 then soft-output-decodes the trellis soft output signal D64, as a soft input, supplied from the trellis SISO decoder 62, by the modulation SISO decoder 63, to generate a modulated soft decision signal D65. This modulated soft decision signal D65 corresponds to the error correction coded data D52 fed to the modulation coder 52 of the recording system.

The magnetic recording and/or reproducing apparatus 50 soft-decodes the modulated soft decision signal D65, as a soft input, supplied from the modulation SISO decoder 63, by the error correction soft decoder 64, to generate soft-output data. This soft-output data is directly output to outside as output data D66, or is binary coded and turned into hard output data D66, which is output to outside.

The magnetic recording and/or reproducing apparatus 50, thus having the SISO type modulation decoder 62 in the reproducing system, is able to perform efficient decoding exploiting the soft information, so that there is no necessity to diminish the information and hence it becomes possible to lower the decoding error rate.

A magnetic recording and/or reproducing apparatus as a second embodiment is now explained. This magnetic recording and/or reproducing apparatus encodes data as correlation is afforded to the fore side data and aft side data in modulation coding and in modulation decoding, instead of encoding/decoding the data on the block basis, while decoding the data in meeting with constraint conditions.

Referring to FIGS. 8 to 11, a modulation decoder of the SISO type, as modulation encoding means applied to the recording system of the magnetic recording and/or reproducing apparatus, is first explained.

The magnetic recording and/or reproducing apparatus performs modulation encoding and modulation decoding, based on a common trellis. Although the trellis structure is changed depending on the limitations imposed on the modulation code, the modulation encoding and modulation decoding, satisfying the (d, k)=(0, 2) limitations, with the code rate R=2/3, is here explained.

Figure 8:
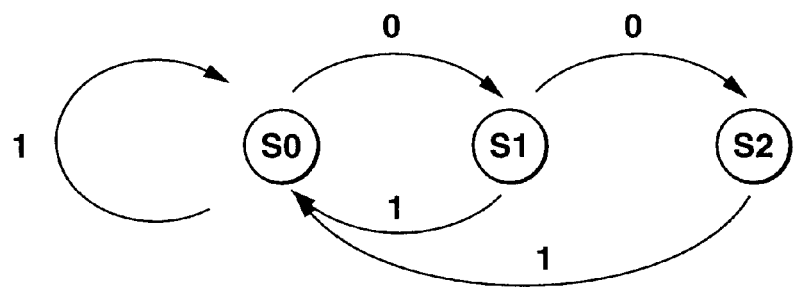
FIG. 8 illustrates a status transition for generating codes satisfying (d, k)=(0, 2) limitations.

FIG. 8 shows a diagram showing the status transition for generating satisfying the (d, k)=(0, 2) limitations. In FIG. 8, labels affixed between the respective states indicate bits output in case of status transition. For example, if the status transition that has occurred is "S0→S1→S2", an output bit string is "00". The bit string output in case status transition has occurred in accordance with the aforementioned status transition diagram necessarily satisfies the (d, k)=(0, 2) limitations.

Assume that the modulation encoding of outputting a 3 bit modulated code for a 2-bit input, with the code rate R=2/3. For generating the modulation code satisfying the (d, k)=(0, 2) limitations, it is apparently sufficient if status transition occurs thrice in accordance with the status transition diagram shown in FIG. 8, with the resulting output being a modulated code.

Figure 9:
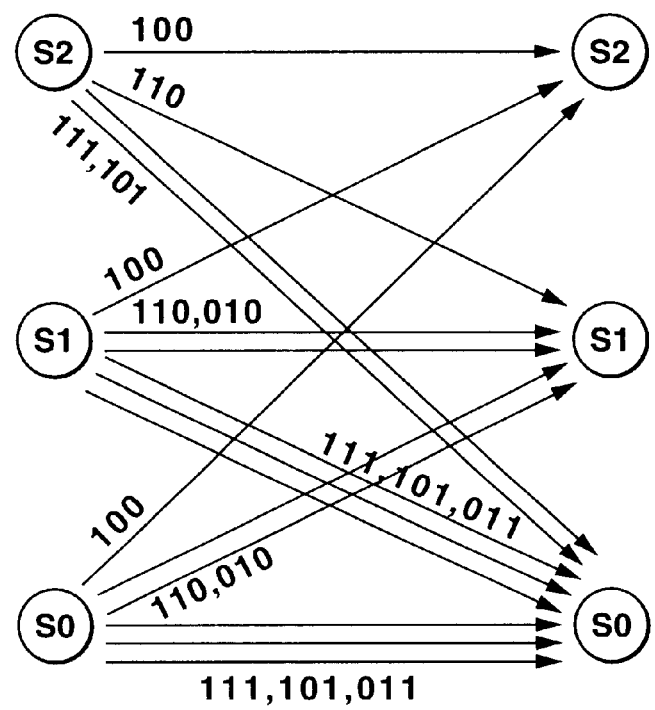
FIG. 9 illustrates a trellis following three times of status transition in accordance with the status transition diagram shown in FIG. 8.

The trellis when the status transition has occurred thrice in accordance with the status transition diagram shown in FIG. 8, that is, a diagram obtained on developing the status transition diagram along the time axis direction, is as shown in FIG. 9. For example, in the trellis shown in FIG. 9, a branch lying at an uppermost position indicates that there is one path starting at the status S2 and again getting to the status S2 after three status transitions, with a corresponding output being "100".

Figure 10:
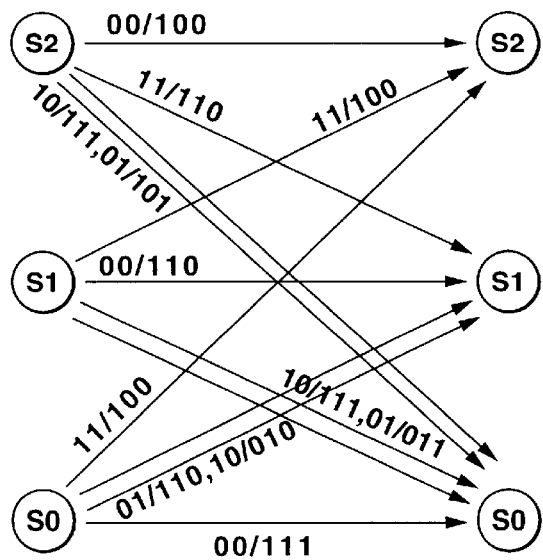
FIG. 10 illustrates a trellis constructed on branch selection from the trellis shown in FIG. 9.

In case of modulation encoding of outputting 3-bit modulated code for an 2-bit input, $2^2$=4 branches are selected from each state, these branches being then allocated to 2-bit inputs of "00, 01, 10, 11" to form a trellis in which an input is associated with an output. FIG. 10 shows a trellis formed on branch selection as described above. In FIG. 10, each label affixed between different states indicate an input/output. For example, in the trellis shown in FIG. 10, a branch S0→S2 indicates that, if "11" is input for the state S0, status transition occurs to the status S2, as "100" is output.

The modulation encoder, applied to the magnetic recording and/or reproducing apparatus, shown as the second embodiment, repeats the status transition for encoding, in accordance with the trellis formed by the above-described sequence of operations, to generate a modulated code string having correlation between input data. The modulation encoder may be provided with components shown for example in FIG. 11.

Figure 11:
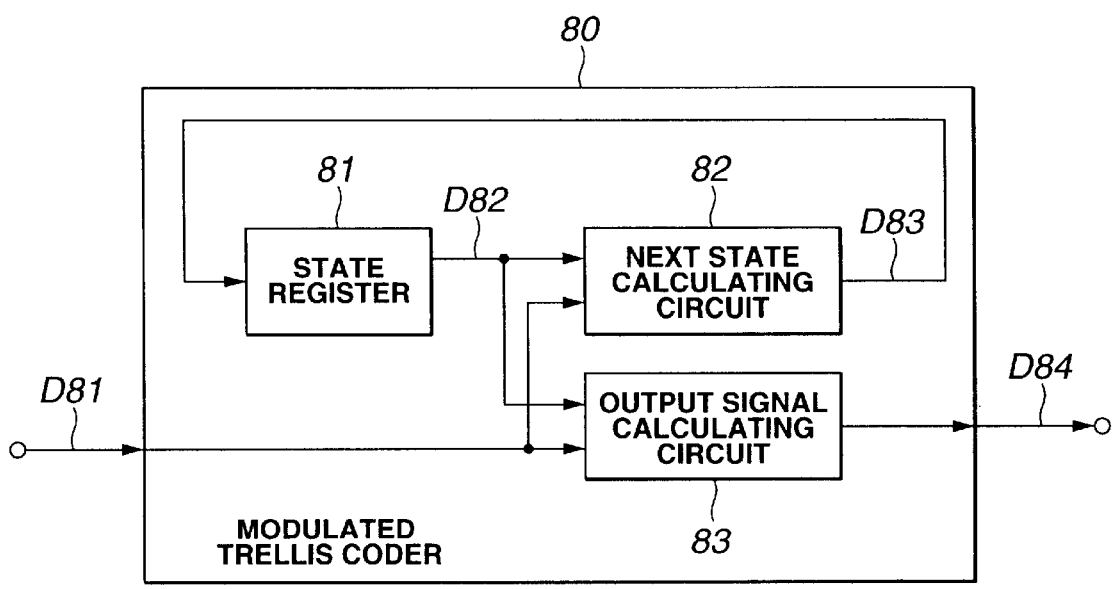
FIG. 11 is a block diagram for illustrating the structure of a modulation trellis encoder applied to a recording system of the magnetic recording and/or reproducing apparatus shown as a second embodiment of the present invention.

The modulation trellis encoder 80, shown in FIG. 11, includes a state register 81 for holding the state of the modulation trellis encoder 80, a next-state calculating circuit 82, for calculating the next transition state, and an output signal calculating circuit 83 for calculating an output signal D84.

The state register 81 is a 2-bit register holding 2 bits specifying the state of the current modulation trellis encoder 80. The state register 81 sends a status signal D82, specifying the 2 bits indicating the current state, to the next-state calculating circuit 82 and to the output signal calculating circuit 83, as the state register 81 holds 2 bits indicating the next state corresponding to the next state signal D83 supplied from the next-state calculating circuit 82.

When fed with the input signal D81 and with the status signal D82, supplied from the state register 81, the next-state calculating circuit 82 calculates the next state in accordance with the following input/output correlating table 4:

TABLE 4

Typical Input/Output Correlating Table

| status signals | input signals | next-state signals |
|---|---|---|
| 0 | 00 | 0 |
| 0 | 01 | 1 |
| 0 | 10 | 1 |
| 0 | 11 | 2 |
| 1 | 00 | 1 |
| 1 | 01 | 0 |
| 1 | 10 | 0 |
| 1 | 11 | 2 |
| 2 | 00 | 2 |
| 2 | 01 | 0 |
| 2 | 10 | 0 |
| 2 | 11 | 1 |
| 3 | 00 | 0 |
| 3 | 01 | 0 |
| 3 | 10 | 0 |
| 3 | 11 | 0 |

The next-state calculating circuit 82 sends the next state signal D83 to the state register 81.

If fed with the input signal D81 and with the status signal D82, supplied from the state register 81, the output signal calculating circuit 83 calculates an output signal D84, in accordance with the following input/output correlating table 5:

TABLE 5

Typical Input/Output Correlating Table

| status signals | input signals | output signals |
|---|---|---|
| 0 | 00 | 111 |
| 0 | 01 | 110 |
| 0 | 10 | 010 |
| 0 | 11 | 100 |
| 1 | 00 | 110 |
| 1 | 01 | 011 |
| 1 | 10 | 111 |
| 1 | 11 | 100 |
| 2 | 00 | 100 |
| 2 | 01 | 101 |
| 2 | 10 | 111 |
| 2 | 11 | 110 |
| 3 | 00 | 111 |
| 3 | 01 | 111 |
| 3 | 10 | 111 |
| 3 | 11 | 111 |

Meanwhile, this output signal D84 satisfies the (d, k)=(0, 2) limitations.

When fed with the input signal D81, the modulation trellis encoder 80 calculates the next state, using this input signal D81 and the status signal D82, by the next-state calculating circuit 82, for storage sequentially in the state register 81. The modulation trellis encoder 80 calculates an output signal D84, by the output signal calculating circuit 83, using the input signal D81 and the status signal D82, by the output signal calculating circuit 83, to output the so-calculated output signal D84.

Since there lacks the status S3 in the modulation trellis encoder 80, if transition to the status S3 occurs before the resetting of the modulation trellis encoder 80, an output signal "111" is instantly output as an output signal D84, based on the Table 5, to realize the function of resetting to the state S0.

A modulation decoder for modulation decoding the signal, modulation-encoded by the above-described modulation encoder, applies the decoding, which is based on the BCJR or SOVA algorithm, in accordance with the trellis previously explained with reference to FIG. 10. With this modulation decoder, the magnetic recording and/or reproducing apparatus is able to perform trellis decoding exploiting the signal correlation in the modulation encoder.

In particular, if, in performing trellis decoding in the magnetic recording and/or reproducing apparatus, SISO decoding of the BCJR or SOVA algorithm is used in the modulation decoder, the soft information can be output to the error correction decoding circuit provided downstream of the modulation decoder, thereby improving the decoding error rate.

The magnetic recording and/or reproducing apparatus, employing this type of the modulation encoder and the modulation decoder, is hereinafter explained with reference to FIG. 12.

Figure 12:
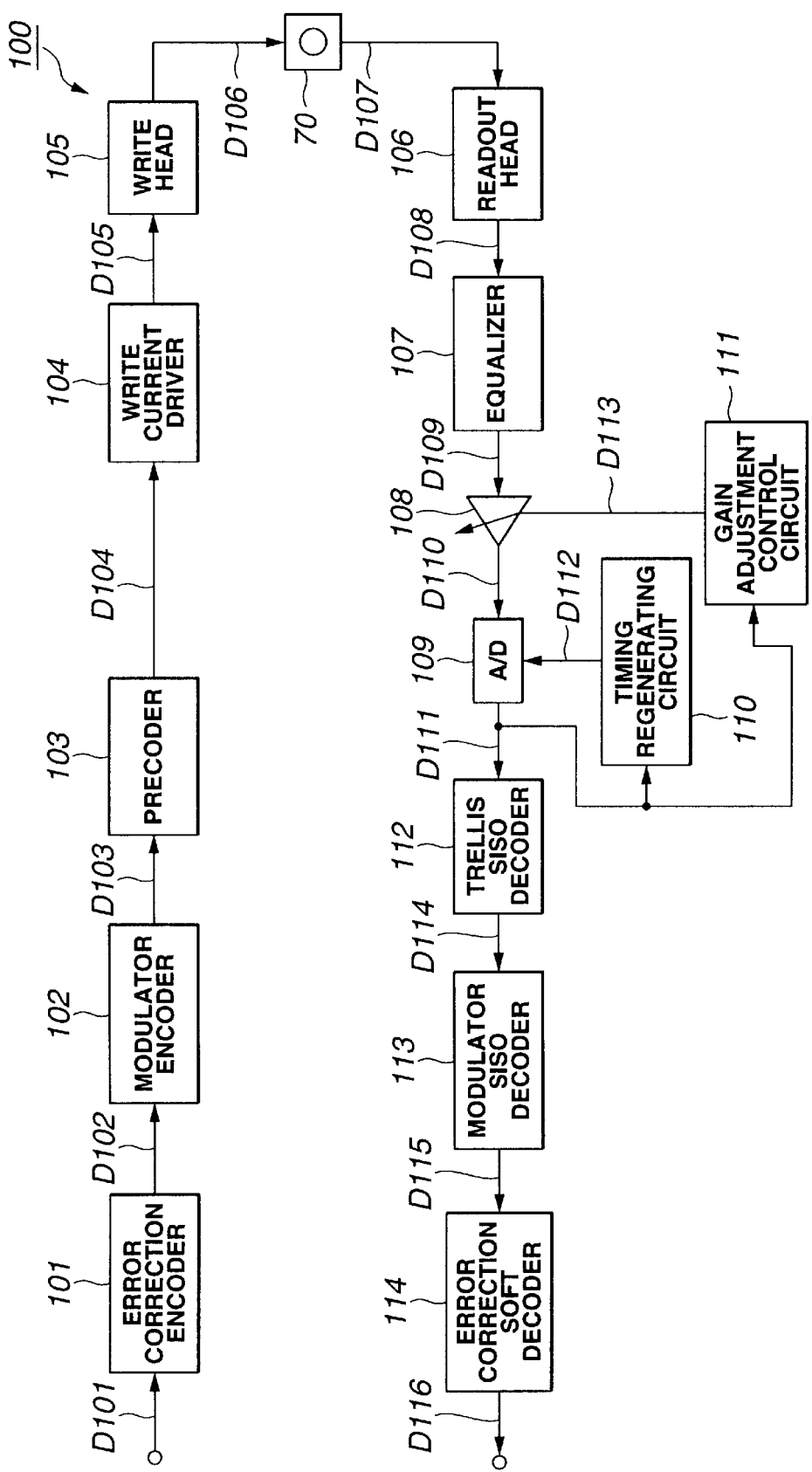
FIG. 12 is a block diagram for illustrating the structure of a modulation trellis encoder applied to a recording system of a magnetic recording and/or reproducing apparatus according to a second embodiment of the present invention.

The magnetic recording and/or reproducing apparatus 100, shown in FIG. 12, includes, as a recording system for recording data on a recording medium 70, an error correction encoder 101 for error correction encoding input data, a modulation encoder 101, a modulation trellis encoder 102 for modulation encoding input data, a precoder 103 for filtering input data for compensating its channel characteristics, a write current driver 104 for converting respective bits of the input data into write current values, and a write head 105 for recording data on the recording medium 70. The magnetic recording and/or reproducing apparatus 200 also includes, as a playback system for reproducing data recorded on the recording medium 70, a readout head 106 for reading out data recording on the recording medium 70, an equalizer 107 for equalizing the input data, a gain adjustment circuit 108 for adjusting the gain of the input data, an analog/digital converter (A/D converter) 109 for converting analog data into digital data, a timing generating circuit 110 for generating clocks, a gain adjustment control circuit 111 for controlling the gain adjustment circuit 108, a trellis SISO decoder 112, as a decoder for modulation decoding the input data, a modulation trellis SISO decoder 113, as an SISO decoder for modulation decoding the input data and an error correction soft decoder 114 for error correction soft decoding the input data.

Similarly to the error correction coder 51 in the magnetic recording and/or reproducing apparatus 50, the error correction encoder 101 in the recording system applies error correction coding to the input data D101. The error correction encoder 101 sends the error correction encoded data, generated on error correction encoding, to the downstream side modulation trellis encoder 102.

The modulation trellis encoder 102, as modulation encoding means, is configured as the aforementioned modulation encoder 80. Specifically, it is a modulation encoder for repeating status transitions in accordance with the trellis, by way of encoding, for generating a modulated code string exhibiting correlation between input data. The modulation trellis encoder 102 applies pre-set trellis modulation coding to the error correction coded data D102, supplied from the error correction encoder 101, to generate modulated encoded data D103 as a string subjected to limitation. The modulation trellis encoder 102 sends the generated modulation encoded data D103 to the downstream side precoder 103.

Similarly to the precoder 53 of the aforementioned magnetic recording and/or reproducing apparatus 50, the precoder 103 filters the modulation encoded data D 103, supplied from the modulation trellis encoder 102, in such a manner as to compensate for channel characteristics from the data writing to the recording medium 70 to the output in the equalizer 107 in the reproducing system, thereby generating a precode signal D104 as a binary signal. The precoder 103 sends the so-generated precede signal D104 to the downstream side write current driver 104.

Similarly to the write current driver 54 in the aforementioned magnetic recording and/or reproducing apparatus 50, the write current driver 104 converts respective bits of the precode signal D104, supplied from the precoder 103, into the write current value $I_S$, to generate a write current signal D105. The write current driver 104 sends the generated write current signal D105 to a downstream side write head 105.

Similarly to the write head 55 in the aforementioned magnetic recording and/or reproducing apparatus 50, the write head 105 applies a write magnetization signal D106, corresponding to the write current signal supplied from the write current driver 104, to the recording medium 70, to record data thereon.

Similarly to the write head 56 in the aforementioned magnetic recording and/or reproducing apparatus 50, the readout head 106 in the reproducing system reads out the readout magnetization signal D107 from the recording medium 70 to generate a readout current signal D108 conforming to the readout magnetization signal D107. The readout head 56 sends the so-generated current signal D108 to the downstream side equalizer 107.

Similarly to the equalizer 57 in the aforementioned magnetic recording and/or reproducing apparatus 50, the equalizer 107 equalizes the current signal D108, supplied from the readout head 106, so that the channel response from the data writing on the recording medium 70 in the recording system up to the outputting at the equalizer 107 will be pre-set characteristics, to generate an equalized signal D109. The equalizer 107 routes the generated equalized signal D109 to the downstream side gain adjustment circuit 108.

Similarly to the gain adjustment circuit 58 in the aforementioned magnetic recording and/or reproducing apparatus 50, the gain adjustment circuit 108 adjusts the gain of the equalized signal D59, supplied from the equalizer 57, based on a gain adjustment control signal D113, supplied from the gain adjustment control circuit 111, to generate a gain adjustment signal D110. The gain adjustment circuit 108 routes the generated gain adjustment signal D110 to the downstream side A/D converter 109.

Similarly to the A/D converter 59 of the aforementioned magnetic recording and/or reproducing apparatus 50, the A/D converter 109 samples and digitizes the gain adjustment signal D110, supplied from the gain adjustment circuit 108, based on the clock signal D112, supplied from the timing regenerating circuit 110, to generate a digital channel signal D111. The A/D converter 109 sends the generated digital channel signal D111 to the timing reproducing circuit 110, gain adjustment control circuit 111 and to the trellis SISO decoder 112.

Similarly to the timing regenerating circuit 60 in the aforementioned magnetic recording and/or reproducing apparatus 50, the timing regenerating circuit 110 regenerates clocks from the digital channel signal D111 supplied from the A/D converter 109 to generate clock signals D112. The timing regenerating circuit 110 sends the generated clock signals D112 to the A/D converter 109.

Similarly to the gain adjustment control circuit 61 of the magnetic recording and/or reproducing apparatus 50, the gain adjustment control circuit 111 generates a gain adjustment control signal D113, which is a control signal used for maintaining the amplitude of the equalized signal D109 at an expected value, based on the digital channel signal D111, supplied from the A/D converter 109. The gain adjustment control circuit 111 sends the generated gain adjustment control signal D113 to the gain adjustment circuit 108.

Similarly to the trellis SISO decoder 62 of the aforementioned magnetic recording and/or reproducing apparatus 50, the trellis SISO decoder 112, as trellis decoding means, is fed with the digital channel signal D111 from the A/D converter 109, and performs soft output decoding, based on the aforementioned BCJR or SOVA algorithm, in accordance with the trellis corresponding to the channel response from the forward stage of the precoder 103 in the recording system to the output of the equalizer 107 of the reproducing system, to generate the trellis soft output signal D114. The trellis SISO decoder 112 sends the so-generated trellis soft output signal D114 to the downstream side modulation trellis SISO decoder 113.

The modulation trellis SISO decoder 113, as modulation decoding means, used for decoding signals encoded by the modulation trellis encoder 102 in the recording system, is an SISO type modulation decoder. The modulation trellis SISO decoder 113, fed with the trellis soft output signal D114 from the trellis SISO decoder 112, finds a soft decision value for the error correction coded data D102, input to the modulation trellis coder 102 in the recording system, to generate a modulated soft decision signal D115. The modulation trellis SISO decoder 113 sends the so-generated modulated soft decision signal D115 to a downstream side error correction soft decoder 114.

Similarly to the error correction soft decoder 54 in the magnetic recording and/or reproducing apparatus 50, the error correction soft decoder 114, as error correction soft decoding means, soft-decodes the modulated soft decision signal D115 from the modulation trellis SISO decoder 113 for error correction codes, based on the aforementioned BCJR or SOVA algorithm, to output the soft-decoded signals to outside as the soft or hard output data D 116.

In recording data on the recording medium 70, the magnetic recording and/or reproducing apparatus 100 is able to apply trellis modulation coding to the error correction coded data D102, generated by the error correction encoder 101, by the modulation trellis encoder 102, to generate modulated encoded data D103. The magnetic recording and/or reproducing apparatus 100 is also able to record the precode signal D104, generated through the precoder 103, on the recording medium 70, through the write current driver 104 and the write head 105.

In reproducing the data recorded on the recording medium 70, the magnetic recording and/or reproducing apparatus 100 soft-output-decodes the digital channel signal D111, as a soft input generated by the readout head 106, equalizer 107, gain adjustment circuit 108 and the A/D converter 109, by the trellis SISO decoder 112, to generate the trellis soft output signal D114. The trellis soft output signal D114 corresponds to the modulation coded data D103 which is an output of the modulation coder 102 of the recording system.

The magnetic recording and/or reproducing apparatus 100 then soft-output-decodes the trellis soft output signal D114, as a soft input, supplied from the trellis SISO decoder 112, by the modulation SISO decoder 113, to generate a modulated soft decision signal D115. This modulated soft decision signal D115 corresponds to the error correction coded data D102 fed to the modulation coder 102 of the recording system.

The magnetic recording and/or reproducing apparatus 100 soft-decodes the modulated soft decision signal D115, as a soft input, supplied from the modulation SISO decoder 113, by the error correction soft decoder 114, to generate soft-output data. This soft-output data is directly output to outside as output data D66, or is binary coded and turned into hard output data D116, which is output to outside.

The magnetic recording and/or reproducing apparatus 100, thus having the SISO type modulation trellis SISO decoder 112 in the reproducing system, is able to perform efficient decoding exploiting the soft information. Moreover, the magnetic recording and/or reproducing apparatus 100 includes the modulation trellis encoder 102 performing trellis modulation coding in the recording system, so that encoding can be made as correlation is afforded to the fore and aft side data. In addition, trellis decoding can be made by the SISO type modulation trellis SISO decoder 112 in meeting with the constraint condition, thus further lowering the decoding error rate.

The above-described magnetic recording and/or reproducing apparatus 50, 100 are able to perform efficient decoding by exploiting the soft information, thereby lowering the decoding error rate. In particular, with the magnetic recording and/or reproducing apparatus 100, encoding can be made as correlation is afforded to the fore and aft side data, without doing block-based encoding or decoding, while trellis decoding can be made in meeting with the constraint conditions, thus further lowering the decoding error rate. That is, the magnetic recording and/or reproducing apparatus 50, 100 is able to realize high precision decoding, thus assuring high operational reliability fort the user.

The present invention is not limited to the above-described embodiment. For example, the present invention may be applied to a recording medium 70 other than the recording medium of the magnetic recording system, that is to a recording medium by the optical recording system, such as a so-called CD (Compact Disc) or to the DVD (Digital Versatile Disc) or to a recording medium of the photomagnetic recording system, such as a so-called magneto-optical disc (MO) disc.

In the above-described embodiment, it is assumed that the magnetic recording and/or reproducing apparatus 100 performs trellis modulation encoding on the encoder side and trellis modulation decoding on the decoder side. However, the present invention is applicable to such a case wherein the trellis modulation decoding is performed on the decoder side to output a soft decision value even in case the trellis modulation encoding is not performed on the encoding side.

Moreover, in the above-described embodiment, it is assumed that the magnetic recording and/or reproducing apparatus 50 or 100 is a unitary apparatus provided with the recording and reproducing systems. Alternatively, a unitary recording apparatus may be configured as a recording system for recording data on a recording medium, while a unitary reproducing apparatus may also be configured as a reproducing system for reproducing the data recorded on the recording apparatus.

In the foregoing, the present invention has been disclosed only by way of illustration and should not be interpreted in a limiting fashion. The scope of the present invention is to be interpreted in light of the description of the following claims.

What is claimed is:

1. A data reproducing apparatus for reproducing data recorded on a recording medium comprising:

trellis soft input soft output (SISO) modulation decoding means for modulation decoding data that is modulation-encoded in a predetermined fashion by modulation encoding means to generate a trellis soft output signal; and modulation SISO decoding means that is fed with the trellis soft output signal for calculating a soft decision value for error correction coded data to generate a modulated soft decision signal;

said modulation SISO decoding means outputting a soft output signal in order to lower a decoding error rate.

2. The data reproducing apparatus according to claim 1 wherein said modulation encoding means performs encoding under a constraint condition; and wherein said modulation SISO decoding means performs soft output decoding in meeting with said constraint condition.

3. The data reproducing apparatus according to claim 2 wherein said modulation SISO decoding means includes:

likelihood calculating means for calculating the likelihood value corresponding to each output codeword output by said modulation encoding means;

said modulation SISO decoding means finding the posterior probability information as soft decision value for an input bit fed to said modulation encoding means and an output bit issued from said modulation encoding means, using the likelihood value calculated by said likelihood calculating means.

4. The data reproducing apparatus according to claim 2 wherein said modulation encoding means performs encoding in accordance with the trellis corresponding to said constraint condition;

said modulation SISO decoding means performing soft output decoding based on the trellis corresponding to said constraint condition.

5. The data reproducing apparatus according to claim 4 wherein said trellis SISO modulation decoding means performs trellis decoding based on the BCJR (Bahl, Cocke, Jelinek and Raviv) algorithm or the SOVA (Soft Output Viterbi Algorithm) algorithm.

6. The data reproducing apparatus according to claim 2 further comprising:

trellis SISO modulation decoding means for performing soft output decoding on a soft input signal based on the trellis corresponding to a channel response; and error correcting soft decoding means for performing soft decoding of error correction codes on a soft input signal;

said modulation SISO decoding means being fed with the soft trellis output signal, as a soft output, from said trellis SISO modulation decoding means, to find a soft decision value for error correction data input to said modulation encoding means to route a modulation soft decision signal as a soft output to said error correction soft decoding means.

7. The data reproducing apparatus according to claim 1 wherein the recording medium is such that data is recorded in accordance with a magnetic, optical or magneto-optical recording system.

8. A data reproducing method for reproducing data recorded on a recording medium comprising the steps of:

reproducing trellis soft input soft output (SISO) modulation-encoded data from said recording medium, being encoded in a predetermined fashion in a modulation encoding step to generate a trellis soft output signal; and modulation SISO decoding the reproduced modulation-encoded data that is fed with the trellis soft output signal for calculating a soft decision value for error correction coded data to generate a modulated soft decision signal, said modulation SISO decoding step outputting a soft output signal in order to lower a decoding error rate.

9. The data reproducing method according to claim 8 wherein said modulation encoding step performs encoding under a constraint condition; and wherein said modulation SISO decoding step performs soft output decoding in meeting with said constraint condition.

10. The data reproducing method according to claim 9 wherein said modulation SISO decoding step includes:

a likelihood calculating step for calculating the likelihood value corresponding to each output codeword output in said modulation encoding step;

said modulation SISO decoding step finding the posterior probability information as a soft decision value for an input bit fed in said modulation encoding step and an output bit issued from said modulation encoding step, using the likelihood value as found by said likelihood calculating step.

11. The data reproducing method according to claim 9 wherein said modulation encoding step performs encoding in accordance with the trellis corresponding to said constraint condition;

said modulation SISO decoding step performing soft output decoding based on the trellis corresponding to said constraint condition.

12. The data reproducing method according to claim 11 wherein said trellis SISO modulation decoding step performs trellis decoding based on the BCJR (Bahl, Cocke, Jelinek and Raviv) algorithm or the SOVA (Soft Output Viterbi Algorithm) algorithm.

13. The data reproducing method according to claim 9 further comprising:

a trellis SISO modulation decoding step for performing soft output decoding on an input signal as a soft input signal based on the trellis corresponding to a channel response; and an error correcting soft decoding step of performing soft decoding of error correction codes in said soft input signal;

said modulation SISO decoding step being fed with the soft trellis output signal, as a soft output, generated in said trellis SISO modulation decoding step, to find a soft decision value for error correction data input in said modulation encoding step to generate a modulation soft decision signal as a soft output;

said error correction soft decoding step performing soft decoding of error correction coded data of said modulation soft decision signal.

14. The data reproducing method according to claim 8 wherein the recording medium is such that data is recorded in accordance with a magnetic, optical or magneto-optical recording system.

15. A data recording and reproducing apparatus for recording and reproducing data on a recording medium, comprising:

modulation encoding means for performing predetermined modulation encoding on said data to be recorded on said recording medium; and modulation SISO decoding means for modulation-decoding the modulation-encoded data reproduced from said recording medium that is fed with a trellis soft output signal for calculating a soft decision value for error correction coded data to generate a modulated soft decision signal;

said modulation SISO decoding means outputting a soft output signal in order to lower a decoding error rate.

16. The data recording and reproducing apparatus according to claim 15 wherein said modulation encoding means performs encoding in accordance with a constraint condition; and wherein said modulation SISO decoding means performs soft output decoding in meeting with said constraint condition.

17. The data recording and reproducing apparatus according to claim 16 wherein said modulation SISO decoding means includes:

likelihood calculating means for calculating the likelihood value corresponding to each output codeword issued from said modulation encoding means; wherein the posterior probability information as soft decision values for an input bit fed to said modulation encoding means and an output bit issued from said modulation encoding means.

18. The data recording and reproducing apparatus according to claim 16 wherein said modulation encoding means performs encoding in accordance with the trellis corresponding to said constraint condition;

said modulation SISO decoding means performing soft output decoding based on the trellis corresponding to said constraint condition.

19. The data recording and reproducing apparatus according to claim 18 wherein a trellis SISO modulation decoding means performs trellis decoding based on the BCJR (Bahl, Cocke, Jelinek and Raviv) algorithm or the SOVA (Soft Output Viterbi Algorithm) algorithm.

20. The data recording and reproducing apparatus according to claim 16, further comprising:

trellis SISO modulation decoding means for performing soft output decoding on a soft input signal based on the trellis corresponding to a channel response; and error correcting soft decoding means for performing soft decoding of error correction codes of a soft input signal;

said modulation SISO decoding means being fed with the soft trellis output signal, as a soft output, from said trellis SISO modulation decoding means, to find a soft decision value for error correction data input to said modulation encoding means to route a modulation soft decision signal as a soft output to said error correction soft decoding means.

21. The data recording and reproducing apparatus according to claim 15 wherein the recording medium is such that data is recorded in accordance with a magnetic, optical or magneto-optical recording system.

22. A data recording and reproducing method for recording and reproducing data for a recording medium, comprising the steps of:

performing predetermined modulation encoding on said data;

recording the modulation-encoded data on said recording medium;

reproducing trellis soft input soft output (SISO) modulation-encoded data from said recording medium to generate a trellis soft output signal; and modulation SISO decoding said reproduced modulation-encoded data that is fed with the trellis soft output signal for calculating a soft decision value for error correction coded data to generate a modulated soft decision signal, said modulation SISO decoding step being outputting a soft output signal in order to lower a decoding error rate.

23. The data recording and reproducing method according to claim 22 wherein said modulation encoding step performing encoding in accordance with a constraint condition; and wherein said modulation SISO decoding step performs soft output decoding in meeting with said constraint condition.

24. The data recording and reproducing method according to claim 23 wherein said modulation SISO decoding step includes:

a likelihood calculating step of calculating the likelihood value corresponding to each output codeword output by said modulation encoding step; wherein the posterior probability information as a soft decision value for an input bit fed in said modulation encoding step and an output bit issued from said modulation encoding step, using the likelihood value calculated in said likelihood calculating step.

25. The data recording and reproducing method according to claim 23 wherein said modulation encoding step performs encoding in accordance with the trellis corresponding to said constraint condition;

said modulation SISO decoding step performing soft output decoding based on the trellis corresponding to said constraint condition.

26. The data recording and reproducing method according to claim 25 wherein said trellis SISO modulation decoding step performs trellis decoding based on the BCJR (Bahl, Cocke, Jelinek and Raviv) algorithm or the SOVA (Soft Output Viterbi Algorithm) algorithm.

27. The data recording and reproducing method according to claim 23, further comprising:

a trellis SISO modulation decoding step for performing soft output decoding on a soft input signal based on the trellis corresponding to channel response; and an error correcting soft decoding step of performing soft decoding of error correction codes of a soft input signal;

said modulation SISO decoding step being fed with the soft trellis output signal, as a soft output, from said trellis SISO modulation decoding step, to find a soft decision value for error correction data input to said modulation encoding step to generate a modulation soft decision signal as a soft output;

said error correction soft decoding step soft-decoding error correction codes of said modulation soft decision signal.

28. The data reproducing method according to claim 22 wherein the recording medium is such that data is recorded in accordance with a magnetic, optical or magneto-optical recording system.

* * * * *